United States Patent
Edelson et al.

(10) Patent No.: US 9,154,130 B2
(45) Date of Patent: Oct. 6, 2015

(54) FOUR-STATE INPUT DETECTION CIRCUITRY

(71) Applicant: Analog Devices, Inc., Norwood, MA (US)

(72) Inventors: Lawrence H. Edelson, Fremont, CA (US); Enrique Romero Pintado, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/498,161

(22) Filed: Sep. 26, 2014

(65) Prior Publication Data

US 2015/0200666 A1    Jul. 16, 2015

Related U.S. Application Data

(60) Provisional application No. 61/927,329, filed on Jan. 14, 2014.

(51) Int. Cl.
*H03K 19/177*    (2006.01)
*H03K 19/00*    (2006.01)

(52) U.S. Cl.
CPC .................................. *H03K 19/0002* (2013.01)

(58) Field of Classification Search
None
See application file for complete search history.

(56) References Cited

U.S. PATENT DOCUMENTS

| | | | | |
|---|---|---|---|---|
| 3,846,708 A * | 11/1974 | Franco | ........................... | 329/303 |
| 4,281,218 A * | 7/1981 | Chuang et al. | ................ | 370/435 |
| 4,410,960 A * | 10/1983 | Kasuya | ......................... | 712/300 |
| 4,884,075 A * | 11/1989 | Mangelsdorf | ................. | 341/159 |
| 5,400,331 A * | 3/1995 | Lucak et al. | ................... | 370/401 |
| 5,469,473 A * | 11/1995 | McClear et al. | ............... | 375/219 |
| 5,491,531 A * | 2/1996 | Adams et al. | ................. | 375/354 |
| 5,714,892 A | 2/1998 | Bowers et al. | | |
| 6,133,753 A | 10/2000 | Thomson | | |
| 6,215,327 B1 * | 4/2001 | Lyke | ............................... | 326/41 |
| 6,765,433 B1 * | 7/2004 | Kao | ............................... | 327/544 |
| 6,768,428 B1 * | 7/2004 | Readler | ........................... | 341/26 |
| 6,937,683 B1 * | 8/2005 | Ratzel | ............................ | 375/376 |
| 7,526,127 B2 * | 4/2009 | Koide et al. | ................... | 382/173 |
| 7,797,561 B1 * | 9/2010 | Abdalla et al. | ................ | 713/322 |
| 2001/0014922 A1* | 8/2001 | Kuge | ............................... | 710/36 |
| 2005/0058234 A1* | 3/2005 | Stojanovic | ..................... | 375/371 |
| 2007/0009066 A1* | 1/2007 | Fredriksson | .................. | 375/326 |
| 2009/0063914 A1* | 3/2009 | Owsley et al. | ................ | 714/718 |
| 2014/0320180 A1* | 10/2014 | Akahane | ....................... | 327/143 |
| 2015/0043693 A1* | 2/2015 | Lee et al. | ...................... | 375/354 |
| 2015/0146624 A1* | 5/2015 | Wiley et al. | ................... | 370/329 |

* cited by examiner

*Primary Examiner* — Crystal L Hammond (74) *Attorney, Agent, or Firm* — Schwegman Lundberg & Woessner, P.A.

(57) ABSTRACT

A circuit to detect states of a signal is provided. The circuit comprises an input node to receive an input signal. A state detection circuit detects a state of the input signal and generates a detection signal. The state corresponds to at least one of three states. Furthermore, the detection signal generated by the state detection circuit has a level based on the detected state of the input signal. A logic discriminator circuit generates first and second state signals based at least partly on the level of the detection signal. A clock detection circuit generates a clock signal based at least partly on a sequence of logic transitions of the first and second state signals.

20 Claims, 7 Drawing Sheets

FOUR-STATE INPUT DETECTION CIRCUITRY

PRIORITY CLAIM UNDER 35 USC 119(e)

The present application claims the benefit under 35 U.S.C. 119(e) of U.S. Provisional Patent Application Ser. No. 61/927,329, filed Jan. 14, 2014, titled "FOUR-STATE INPUT DETECTION CIRCUITRY," which is incorporated herein by reference in its entirety.

FIELD

This application relates to the field of circuits, and particularly to circuits to detect states of an input signal.

BACKGROUND

A "tri-state" signal is a digital logic signal that can assume three possible states: a logic "HIGH" state, a logic "LOW" state, and a "HIGH-IMPEDANCE (HIGH-Z) state". In the HIGH and LOW states, the tri-state signal may take on respective voltage levels (e.g., about Vdd and about Vss). In the HIGH-Z state, the tri-state signal presents high impedance looking into the circuitry providing the tri-state signal. Moreover, typically, the voltage level of the tri-state signal in the HIGH-Z state is permitted to float.

Tri-state signals can be beneficially employed in conventional binary logic circuits. Assume an integrated circuit (IC) has two available input/output (I/O) pins. If the pins are connected to a conventional binary receiving circuit, each I/O pin is allowed to be either a zero or a one, providing a total of four possible input combinations (00, 01, 10, 11, where "0"=LOW state and "1"=HIGH state). However, if the receiving circuit is capable of detecting the three states of a tri-state signal, a total of nine input combinations (00, 01, 0Z, 10, 11, 1Z, Z0, Z1, ZZ, where "Z"=HIGH-Z state) are possible. Tri-state input signals thus increase the amount of information that can be conveyed into a receiving circuit for a given number of pins.

Overview

The systems, methods, and devices of the inventive subject matter each have several aspects, no single one of which is solely responsible for its desirable attributes. Without limiting the scope of the embodiments of the invention as expressed by the claims which follow, some features will now be discussed briefly. After considering this discussion, and particularly after reading the section titled "Detailed Description," one will understand how the features of the embodiments of the invention provide benefits that include improving input detection circuitry.

In one embodiment, a circuit to detect signal states is disclosed. The circuit comprises an input node to receive an input signal. The circuit further comprises a state detection circuit to detect a state of the input signal and to generate a detection signal. The state can correspond to at least one of three states. The detection signal can have a level based on the detected state of the input signal. The circuit further comprises a logic discriminator circuit to generate first and second state signals based at least partly on the level of the detection signal. The circuit further comprises a clock detection circuit to generate a clock signal based at least partly on a sequence of logic transitions of the first and second state signals.

In another embodiment, a method to detect input states is disclosed. The method comprises receiving an input signal. The method further comprises generating a detection signal based on detecting a state of the input signal. The state can correspond to at least one of three states. The detection signal can have a level based on the detected state of the input signal. The method further comprises generating first and second state signals based at least partly on the level of the detection signal. The method further comprises generating a clock signal based at least partly on a sequence of logic transitions of the first and second state signals In another embodiment, an apparatus to detect input states. The apparatus comprises means for receiving an input signal. The apparatus further comprises means for detecting a state of the input signal and to generate a detection signal. The state can correspond to at least one of three states. The detection signal can have a level based on the detected state of the input signal. The apparatus further comprises means for generating first and second state signals based at least partly on the level of the detection signal. The apparatus further comprises means for generating a clock signal based at least partly on a sequence of logic transitions of the first and second state signals.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following detailed description of embodiments presents various descriptions of specific embodiments of the invention. However, the inventive subject matter can be embodied in a multitude of different ways as defined and covered by the claims. In this description, reference is made to the drawings where like reference characters may indicate identical or functionally similar elements.

Embodiments are described herein in the context of systems and methods for circuits applicable to, but not limited to, electronics and circuits associated with state detection of an input signal, including circuits related to power controllers, power regulators, power harvesting, mobile devices, sensors, detectors, and transducers.

As stated, a "tri-state" signal includes a digital logic signal that can assume three possible states: a logic "LOW" state, a logic "HIGH" state, and a "HIGH-Z" (also referred to as a "high-impedance" or "float") state. In the HIGH-Z state, a tri-state signal presents high impedance to the circuitry which receives it. Tri-state input signals can increase the amount of information that can be conveyed into a receiving circuit for a given number of pins. Additionally, adding a "fourth state" to an input signal can further increase the amount of information that a digital logic signal can provide. An example of a fourth state is a valid "synchronize" ("SYNC") state of the input signal. In the SYNC state, an input signal transitions between states (e.g., HIGH, LOW, or HIGH-Z) in a predetermined pattern to indicate a clock signal. In one example aspect, the SYNC state can provide synchronization information. Thus, there is a need for four-state input detection.

In example embodiments described herein, an input-stage circuit can detect four-state input signals received at an input pin. The input signal can be in one of the LOW, HIGH, HIGH-Z, or SYNC states. The tri-states LOW, HIGH, HIGH-Z can correspond to static states. The SYNC state can correspond to a dynamic state that is defined based on transitions of the tri-states. The input-stage circuit can detect the SYNC state based on detecting logic state transitions of the input signal. In one particular example, two or more consecutive alternating HIGH-LOW state transitions with intervening HIGH-Z states detected at the input pin can indicate a period of the SYNC state. For example, the input-state circuit can detect a SYNC state of the input signal in response to the input signal transitioning (or detected as transitioning) sequentially from LOW, to HIGH-Z, to HIGH, to HIGH-Z, and to LOW. In alternative embodiments, other patterns of state transitions can be used to define the SYNC state. In response to detecting a valid SYNC state, the input-stage circuit can generate a clock signal CLK for indication of a valid SYNC state and/or for synchronization.

In particular, in an example embodiment, the input-stage circuitry can include a state detection circuit, a logic discriminator circuit, and a clock detection circuit. The state detection circuit can receive the input signal and can generate a state detection signal to indicate the "static" tri-state (e.g., LOW, HIGH, HIGH-Z states) of the input signal. For instance, the state detection circuit can generate the state detection signal at one of three levels (e.g., voltage levels, current levels, or other electrical characteristic levels), each level corresponding to a respective tri-state. The logic discriminator circuit encodes the level of the detection signal to binary logic values. For example, the tri-states can be encoded onto two binary logic signals ("state signals"). The clock detection circuit can monitor the transitions of the state signals and advance a clock signal if the state signals transition in a pattern indicative of a valid SYNC state.

Various input detection circuits have been used to detect the state of a tri-state input signal. However, these tri-state detection circuitries can have a number of drawbacks. In some circuitry, in order for the input logic state to be detected and latched, sampling signals are used to briefly activate detection circuitry on the input node, and downstream circuitry latch the circuit's outputs during the sampling period. As such, these circuits can become impractical for reliably detecting a four-state input signal because the sampling of the input pin can interfere with detection of the SYNC state. Moreover, sampling the input pin can restrict the frequencies of the SYNC state that can be detected. Accordingly, there is a need for asynchronous detection of four-state signals.

Another drawback of some tri-state detection circuitry can arise due to a large number of components needed for implementing tri-state detection circuitry. Having a large number of components can occupy a considerable amount of area on an integrated circuit ("IC") die. As die space can be expensive, the circuit's complexity can incur a high cost. Accordingly, there is a need to reduce the complexity and/or size of state detection circuitry.

Various embodiments described herein can provide continuous pin operation for the identification of the tri-states. For example, the state detection circuit can process the input signal and generate the detection signal asynchronously (e.g., independent of a sampling signal). Accordingly, example embodiments can provide detecting a valid SYNC state of the input signal. Moreover, some example embodiments of the input-stage circuit can include fewer components or occupy less space than other state detection circuits. Various embodiments are described in greater detail below.

Figure 1:
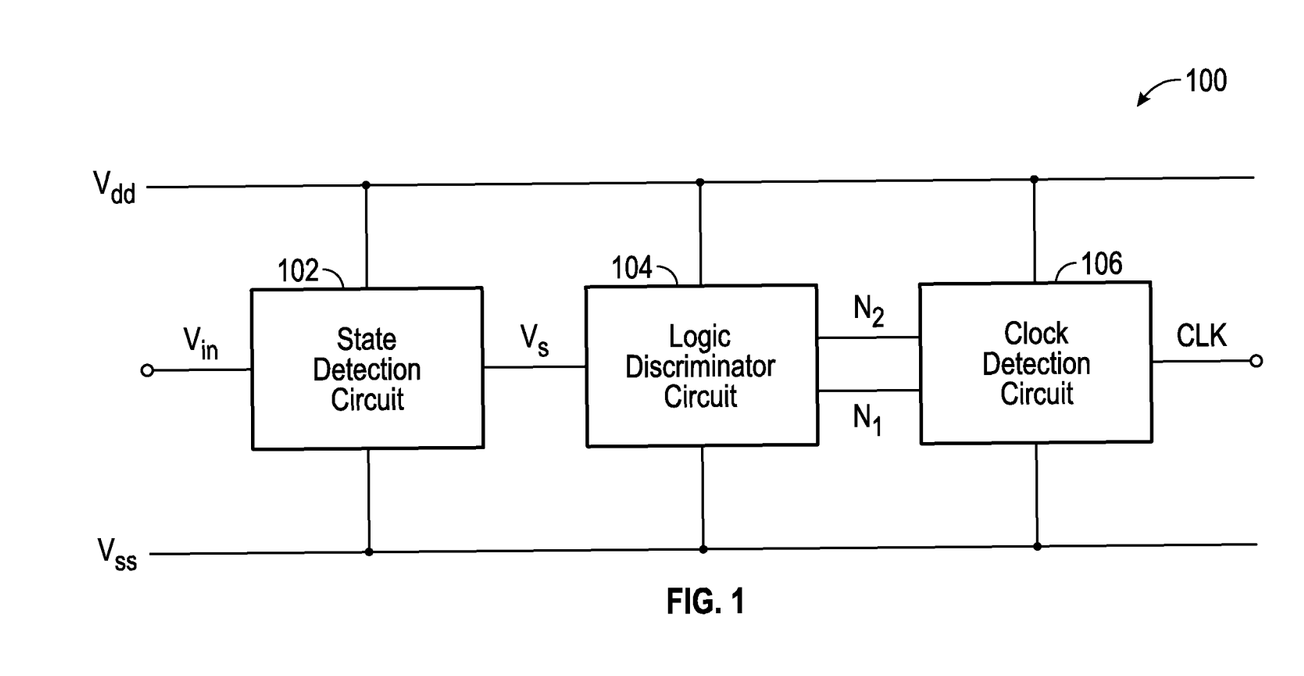
FIG. 1 is a schematic block diagram illustrating an input-stage circuit for detecting a four-state signal in accordance with embodiments described herein.

FIG. 1 is a schematic block diagram illustrating an input-stage circuit 100 for detecting a four-state signal in accordance with embodiments described herein. The input-stage circuit 100 can include a state detection circuit 102, a logic discriminator circuit 104, and a clock detection circuit 106. The input-stage circuit 100 receives an input signal Vin as an input, receives signals Vdd and Vss as power supplies, and generates signals N1, N2, and CLK as outputs. In an example embodiment, the input signal Vin can be received at a node, a terminal, a pin, pad, or the like input structures. The input signal Vin can be provided by a driver circuit (not shown) that generates the input signal Vin in one or more of three static states: a LOW state, a HIGH state, and a HIGH-Z state. The signals N1, N2, and/or CLK can be provided to external circuitry (not shown), such as, but not limited to, related to power controllers, power regulators, power harvesting, mobile devices, sensors, detectors, and transducers.

The state detection circuit 102 of the input-stage circuit 100 can include circuitry that detects the state of the input signal Vin. As such, the state detection circuit 102 can receive the input signal Vin as an input and can generate a detection signal Vs as an output for indicating the detected state. In an example embodiment, the state detection circuit 102 may detect whether the input signal Vin is in a logic LOW state, a logic HIGH state, or a HIGH-Z state. As will be described below in greater detail, the clock detection circuit 106 can detect the SYNC state based at least on detecting that the input signal Vin has switched between the HIGH, LOW, and HIGH-Z states.

The state detection circuit 102 can provide an indication of the detected state (e.g., one of the HIGH, LOW, and HIGH-Z states) by generating the state detection signal Vs at one of three levels. For instance, the state detection circuit 102 can generate the detection signal Vs at a first voltage level (e.g., a logic HIGH) in response to the input signal Vin being in the logic HIGH state, can generate the detection signal Vs at a second voltage level (e.g., a logic LOW) in response to the input signal Vin being in the logic LOW state, and can generate the detection signal Vs at a third voltage level (e.g., an intermediary level between logic LOW and HIGH) in response to the input signal Vin being in the HIGH-Z state. It will be appreciated that the levels need not be voltage levels, but rather the levels can be embodied as any suitable electrical characteristics that can be detected, such as currents, resistances, inductances, capacitances, impedances, and the like.

In particular, as will be described below in greater detail in connection with FIG. 2, an example embodiment of the state detection circuit 102 electrically couples the signals Vin and Vs of the state detection circuit 102. In operation, the state detection circuit 102 weakly pulls the output signal Vs of the state detection circuit 102 to the third level of the state detection signal Vs. In particular, an external circuit (not shown) driving the input signal Vin to the HIGH or LOW states should overcome the pull-down or pull-up action of the state detection circuit 102. Accordingly, in operation, the state detection signal Vs takes on a value of the input signal Vin in response to the external circuit setting the state of Vin either HIGH or LOW. Furthermore, the state detection signal Vs will be pulled to the third level in response to the external circuit setting the state of Vin to the HIGH-Z state because the external circuit permits the voltage of the input signal Vin to float.

The third level may correspond to a voltage that is a threshold voltage from the supply Vdd or a threshold voltage from the supply Vss. In this way, the first, second, and third levels of the signal Vs can be distinct levels. It will be appreciated by a person skilled in the art that the first, second, and third levels can correspond to any three values separated by amounts suitable for reliably detecting the three distinct levels.

The logic discriminator circuit 104 of the input-stage circuit 100 can include circuitry that encodes the three levels of the detection signal Vs to two or more logic states. For example, in the illustrated embodiment, the logic discriminator circuit 104 receives the detection signal Vs as input from the state detection circuit 102 and generates first and second state signals N1, N2 as outputs based on detecting the level of the detection signal Vs. The first and second state signals N1, N2 can each be in either a HIGH or LOW state. The combination of the pair (N1, N2) can indicate the level of the detection signal Vs and, in turn, the detected state of the input signal Vin.

As will be described in greater detail later in connection with FIG. 2, an example embodiment of the logic discriminator circuit 104 generates the pair (N1, N2) in a (HIGH, HIGH) state in accordance with detecting that the level of the state detection signal Vs corresponds to Vin being in a logic HIGH state, generates the pair (N1, N2) in a (LOW, LOW) state in accordance with detecting that the level of the state detection signal Vs corresponds to Vin being in a logic LOW state, and generates the pair (N1, N2) in a (HIGH, LOW) state or (LOW, HIGH) state in accordance with detecting that the level of the state detection signal Vs corresponds to Vin being in a HIGH-Z state. It will be appreciated by a person of ordinary skill that in alternative embodiments the pair (N1, N2) can be assigned any three distinct pair-wise logic values for the three respective states of the state detection signal Vs.

The clock detection circuit 106 of the input-stage circuit 100 can include circuitry that detects the SYNC state of the input signal Vin. For example, in the illustrated embodiment, the clock detection circuit 106 receives the first and second state signals N1, N2 as inputs from the logic discriminator circuit 104 and generates the clock signal CLK as an output based at least partly on the state signal N1, N2. The clock signal CLK may be a signal that alternates between two or more values (e.g., Vdd and Vss). The clock detection circuit 106 can generate the clock signal CLK by advancing the clock signal CLK by one or more cycles.

As stated, the SYNC state of the input signal Vin can correspond to the input signal Vin changing states in a predetermined pattern. Because the states of the pair of state signals (N1, N2) are indicative of the state of the input signal Vin, the clock detection circuit 106 can monitor the state signal N1, N2 to detect a sequence of changes of the pair (N1, N2) that correspond to the predetermined sequence of state changes of the input signal Vin for the SYNC state. An example sequence of the pair (N1, N2) includes a sequence that is indicative of the input signal Vin switching between first and second states. In an example embodiment, the sequence may include an intervening third state between transitioning between the first and second states. For instance, the clock detection circuit 106 can generate the clock signal CLK in response to the pair (N1, N2) indicating that the input signal Vin has switched between LOW and HIGH states, regardless of intervening HIGH-Z states, such as state transitions LOW, to HIGH-Z, then to HIGH, then to HIGH-Z, and then to LOW in sequence. In another example embodiment, the clock detection circuit 106 generates a period of the clock signal CLK in response to the pair (N1, N2) indicating that the input signal Vin has switched from LOW, to HIGH, and then to LOW, without any intervening HIGH-Z states or without detecting an intervening HIGH-Z state. In other words, an intervening HIGH-Z state can inhibit the clock detection circuit 106 from advancing the clock signal CLK.

It will be appreciated, however, by a person of ordinary skill that other sequences may be used, including switching between HIGH and HIGH-Z states without switching to an intervening LOW state, or switching between LOW and HIGH-Z states without switching to an intervening HIGH state. Furthermore, one or more separate clock signals CLK may be generated in response to respective patterns. An example embodiment of a clock detection circuit 106 that can generate more than one clock signal will be described in greater detail in connection with FIG. 4.

In one example aspect, among others, of some embodiments, the input-stage circuit 100 can perform asynchronous detection of the state of the input signal Vin. For example, the state detection circuit 102 can detect the state of the input signal Vin without using a separate synchronization or clock signal and/or without latching the input Vin. In other words, one or more (including each) of the circuits 102, 104, 106 may change its output(s) based on its input(s) independent of a synchronization signal. By using asynchronous detection of the state of Vin, the input-stage circuit 100 can identify a wide-class of "clock states" of the input signal Vin, as will be described in greater detail later in connection with the clock detection circuit 106 of FIG. 2. Further features and benefits of the inventive subject matter will be apparent to those skilled in the art from the following detailed descriptions, taken together with accompanying drawings.

Figure 2:
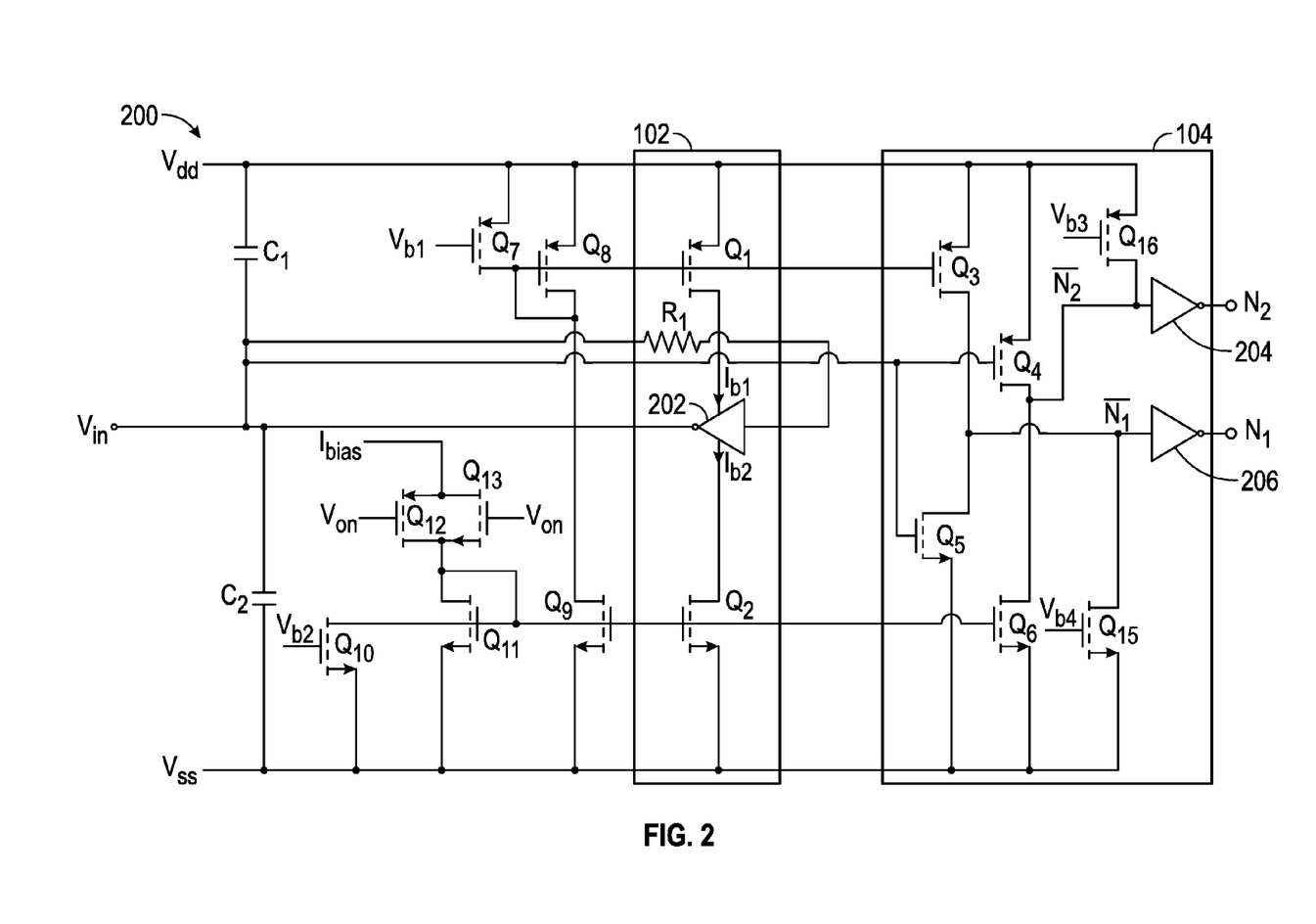
FIG. 2 is a schematic block diagram illustrating a sub-circuit including example embodiments of a state detection circuit and a logic discriminator circuit of FIG. 1.

FIG. 2 is a schematic block diagram illustrating a sub-circuit 200 including example embodiments of the state detection circuit 102 and the logic discriminator circuit 104 of FIG. 1. The state detection circuit 102 includes transistors $Q_1$, $Q_2$ and an inverter 202. The logic discriminator circuit 104 includes transistors $Q_3$, $Q_4$, $Q_5$, $Q_6$ and inverters 204, 206. In the illustrated embodiments, the sub-circuit 200 can also include biasing circuitry, such as transistors $Q_7$-$Q_{13}$, as well as housekeeping circuitry, such as transistors $Q_{15}$, $Q_{16}$.

In the illustrated embodiment, the inverter 202 has an input coupled to Vin through the resistor R1 and has an output coupled to Vin. Accordingly, the inverter 202 and the resistor form a feedback path that electrically couples Vin and Vs. Moreover, the transistor Q1 (e.g., a p-channel metal-oxide-semiconductor field-effect transistor (MOSFET)) and the transistor Q2 (e.g., an n-channel MOSFET) can serve as current sources to provide bias currents to the inverter 202. In particular, the inverter 202 receives a first bias current Ib1 from the drain of the transistor Q1 and a second bias current Ib2 from the drain of the transistor Q2. In the embodiment illustrated in FIG. 2, the transistor Q1 provides the first bias current Ib1 at a level based on a bias at the gate of the transistor Q1 that is set by the transistor Q8. For example, as described below, the transistor Q8 conducts a current across its source and drain, which sets the gate voltages of the transistors Q8 and Q1, in accordance with a current that is pulled by a current mirror system. The first bias current Ib1 can flow from the drain of the transistor Q1 to a first bias input (e.g., "Vdd power input") of the inverter 202.

The transistors Q11, Q9, Q6 and Q2 can serve as a mirror system. For example, the transistor Q11 can receive the bias current Ibias at the drain of the transistor Q11 to form a bias voltage at the gates of the transistors Q11, Q9, Q2, and Q6. Accordingly, the transistor Q2 can provide the second bias current Ib2 at a level that is based on a bias set at the gate of the transistor Q2 by the current mirror formed from the transistors Q11, Q9, Q6 and Q2. The second bias current Ib2 can flow from a second bias input (e.g., "Vss power input") of the inverter 202 to the drain of the transistor Q2.

Additionally or alternatively, the transistors Q1 and Q2 can correspond to imbalanced current sources for the Vdd and Vss power inputs of the inverter 202. In other words, the current source formed by the transistor Q1 and the current source formed by the transistor Q2 can provide different levels of current. In one particular embodiment, the first current source formed from the transistor Q1 can provide a current of about 10 microamperes (µA), and second current source formed from the transistor Q2 can provide a current of about 8 µA. In example embodiment, the transistor Q1, Q2 are sized such that the transistor Q1 provides a current that is about 5% or greater than the current of the transistor Q2. In another embodiment, the transistor Q1 can provide a current that is about 3% to about 50% greater than the current of the transistor Q2. In another embodiment, the transistor Q1 can provide a current that is about 1% to about 1000% greater than the current of the transistor Q2. The amount of current and the amount of mismatch between the currents of the transistors Q1 and Q2 can be selected based on various considerations, such as, but not limited to, settling time, power consumption, and/or pull-down capabilities of a circuit connected to the input pin.

In operation, the arrangement of the inverter 202 in feedback configuration and coupled with the imbalanced currents from the transistors Q1 and Q2 can serve to pull up or pull down a "floating" Vs (e.g., Vin is in the HIGH-Z state) to a voltage from the positive rail (VDD) or the negative rail (VSS). For example, in the case that the transistor Q1 provides greater current than the transistor Q2, the inverter 202 can weakly pull the signal Vs up to a third level corresponding to a value below the positive rail Vdd. Accordingly, the inverter 202 can pull the signal Vs up to the third value in response to Vin being in the HIGH-Z state. In an alternative embodiment, if the sign of the mismatch were such that the current of the transistor Q2 is greater than the magnitude of the current of the transistor Q2, the inverter 202 can weakly pull the signal Vs down to a third level corresponding to a value above the negative rail Vss. Accordingly, the inverter 202 can pull the signal Vs down to the third value in response to Vin being in the HIGH-Z state.

As stated, the state detection circuit 102 can weakly pull the signal Vs to the third level that is some voltage away from a power supply (e.g., either Vdd or Vss). For example, where in operation the transistor Q1 provides 10 µA and the transistor Q2 provides 8 µA, the transistor Q1 reduces its bias current to the inverter 202 in response to the transistor Q1's gate voltage falling below approximately a threshold voltage Vt from the source of the transistor Q1. Since the transistor Q1 supplies the 10 µA current in saturation, the transistor Q1 has approximately a 200 mV channel support voltage, which can result in an additional 200 mV offset added to the threshold Vt. Accordingly, the bias current provided by the transistor Q1 should diminish as the floating signal Vs approaches the threshold Vt of the transistor Q1 plus the 200 mV offset value. Thus, as a result, the floating signal Vs should be inhibited from getting closer than approximately the threshold voltage Vt plus 200 mV. In other words, the third level can correspond to a threshold voltage Vt of the dominate transistor of Q1 or Q2 (e.g., the transistor providing greater current) plus an offset voltage that corresponds to the channel support voltage of the dominant transistor.

The characteristic that the "float" voltage of the state detection signal Vs is inhibited from rising more than a threshold voltage Vt (plus an offset) from the power supply Vdd provides a distinct logic state to be recognized apart from the levels of the LOW and HIGH states. For example, in addition to a HIGH and a LOW logic state, a third logic state can be indicated by the signal Vs floating to the third level corresponding to at least a threshold Vt plus an offset from the rails Vdd and Vss. In some embodiments, the input pin of Vin can source 8 µA when the input signal Vin is pulled HIGH by a driver circuit, and can sink 10 µA when the input signal Vin is pulled LOW by a driver circuit.

In the illustrated embodiment, the transistor Q3 of the logic discriminator circuit 104 can correspond to a 2 µA p-channel MOSFET (PMOS) current source. The transistor Q6 of the logic discriminator circuit 104 can correspond to a 2 µA to n-channel MOSFET (NMOS) current source (e.g., sink). The transistors Q5, Q6 can correspond to a small width n-channel MOSFET and a small width p-channel MOSFET, respectively. For example, in a 5-Volt process, the length of the transistor channels can be about 0.5 microns to about 0.6 microns, and the width can be about 0.35 microns. In other embodiments, the transistors can have other sizes selected based on the process technology, as well as other considerations. Using small width channel transistors can reduce the parasitic capacitances of the transistors.

Now turning to the logic discriminator circuit 104, the transistor Q4 can be arranged as a switch disposed between the power supply Vdd and a pull-down circuit. For example, in the illustrated embodiment, the pull-down circuit corresponds to the transistor Q6 arranged as a pull-down current source. The transistor Q4 can correspond to a PMOS transistor having a source coupled to Vdd, a gate coupled to Vs, and a drain coupled to $\overline{N}_2$. The transistor Q6 can correspond to an NMOS transistor having a source coupled to Vss, a gate coupled to a bias (e.g., produced by transistor Q11 and the bias current Ibias of the current mirror system), and a drain coupled to $\overline{N}_2$. The inverter 204 can set N2 by performing a logical negation operation on $\overline{N}_2$ between the drains of the transistors Q4, Q6.

Furthermore, the transistor Q5 can be arranged as a switch disposed between a pull-up circuit and the power supply Vss. For example, in the illustrated embodiment, the pull-up circuit corresponds to the transistor Q3 arranged as a pull-up current source. The transistor Q5 can correspond to an NMOS transistor having a source coupled to Vss, a gate coupled to Vs, and a drain coupled to $\overline{N}_1$. The transistor Q3 can correspond to a PMOS transistor having a source coupled to Vdd, a gate coupled to a bias (produced by transistor Q7 and bias input Vb1), and a drain coupled to $\overline{N}_1$. The inverter 206 can set N1 by performing a logical negation operation on a node $\overline{N}_1$ between the drains of the transistors Q3, Q5. In some embodiments, the inverters 204, 206 can be replaced by Schmitt triggers. Accordingly, the Schmitt triggers can generate the state signal N1, N2 in accordance with comparing $\overline{N}_1$, $\overline{N}_2$ with a logic threshold and based on a hysteresis.

The arrangement of the transistors Q3-Q6 and inverters 204, 206 of the logic discriminator circuit 104 can generate the state signals N1 and N2 as distinct pairs of logic HIGH or LOW states based on the level of the signal Vs. For example, in operation, the gates of the transistors Q4, Q5 receive the state detection signal Vs. In response to Vs being set at the HIGH level, the transistor Q4 turns off and thus the transistor Q6 pulls down $\overline{N}_2$. Accordingly, the inverter 204 performs a logical negation operation on $\overline{N}_2$ LOW and asserts N2 HIGH. Likewise in response to Vs being in the HIGH state, the transistor Q5 turns on and conducts the current from the transistor Q3, thus pulling down $\overline{N}_1$. Accordingly, the inverter 206 performs a logical negation operation on $\overline{N}_1$ and asserts N1 HIGH. Consequently, the logic discriminator circuit 104 encodes the HIGH level of the signal Vs as (N1, N2)=(HIGH, HIGH).

Furthermore, in response to Vs being set at the LOW level, the transistor Q4 conducts the current of the transistor Q6 and turns on, which pulls up $\overline{N}_2$. Accordingly, the inverter 204 performs a logical negation operation on $\overline{N}_2$ and asserts N2 LOW. Likewise in response to Vs being in the LOW state, the transistor Q5 turns off and the transistor Q3 pulls up $\overline{N}_1$. Accordingly, the inverter 206 performs a logical negation operation on $\overline{N}_1$ HIGH and asserts N1 LOW. Consequently, the logic discriminator circuit 104 encodes the LOW level of the signal Vs as (N1, N2)=(LOW, LOW).

Furthermore, in response to Vs being in the third level (e.g., Vin is neither within a threshold Vt of Vdd or Vss), the transistor Q4 conducts the current of the transistor Q6 and turns on, which pulls up $\overline{N}_2$. Accordingly, the inverter 204 performs a logical negation operation on $\overline{N}_2$ HIGH and asserts N2 LOW. Likewise in response to Vs being in the LOW state, the transistor Q5 conducts the current of the transistor Q3 and turns on, which pulls down $\overline{N}_1$. Accordingly, the inverter 206 performs a logical negation operation on $\overline{N}_1$ LOW and asserts N1 HIGH. Consequently, the logic discriminator circuit 104 encodes the third level of the signal Vs as (N1, N2)=(HIGH, LOW).

Accordingly, the logic discriminator circuit 104 can generate distinct states to resolve the static state of the input signal Vin as high, low or float, e.g., (N1, N2)=(HIGH, HIGH) if Vs is HIGH; (N1, N2)=(LOW, LOW) if Vs is LOW; (N1, N2)=(HIGH, LOW) if Vs is the third level. It will be appreciated by a person of ordinary skill that in other embodiments different states of N1 and N2 can correspond to different states of Vin. For example, in one particular embodiment, the state signals N1, N2=LOW can be generated in response to detecting Vin as being HIGH, the signals N1, N2=HIGH can be generated in response to detecting Vin as being HIGH, and/or the signal N1=LOW and N2=HIGH can be generated in response to detecting Vin as being in the HIGH-Z state. Detecting a valid SYNC state of Vin will be described in greater detail below.

In one example aspect, among others, of some embodiments, the state detection circuit 102 and the logic discriminator circuit 104 can perform asynchronous detection of the state of the input signal Vin and encoding the state into the logic pair (N1, N2). For example, the state detection circuit 102 and the logic discriminator circuit 104 can generate Vs and N1, N2 without using a separate synchronization or clock signal and/or without latching the input Vin. In other words, the state detection circuit 102 and the logic discriminator circuit 104 may change its output(s) based on its input(s) independent of a synchronization signal. By using asynchronous detection of the state of Vin, the state detection circuit 102 and the logic discriminator circuit 104 can identify a wide range of frequencies of the SYNC state.

The capacitor C1 has a first end coupled to the supply Vdd and a second end coupled to the input Vin. Likewise, the capacitor C2 has a first end operatively coupled to the input Vin and a second end operatively coupled to the supply Vss. In one example aspect, the capacitors C1, C2 can provide filtering of alternating current (AC) signal. In an alternative embodiment, the capacitors C1, C2 can be omitted.

Transistors Q7, Q10, Q15, Q16 form a portion of housekeeping circuitry. For example, the transistors Q7, Q10 can serve as switches or trimming devices controlled by bias voltages Vb1, Vb2. The transistors Q14, Q15 can provide power-down operation that sets N2 in a LOW state and N1 in a HIGH state. In particular, the transistor Q16 can be arranged as a switch that couples or decouples Vdd from the input of the inverter 204 based on a control signal Vb3. The transistor Q15 can be arranged as a switch that couples or decouples Vss from the input of the inverter 206 based on a control signal Vb4. In an alternative embodiment, the transistors Q7, Q10, Q15, Q16 can be omitted.

Transistors Q12, Q13 are operatively coupled as a switch. For example, when activated by the control signal Von, the transistors Q12, Q13 carry a bias current Ibias that can be replicated by the current mirror formed by transistors Q1, Q2 and the current mirror formed by the transistors formed from transistors Q7, Q8. In an alternative embodiment, the transistors Q12, Q13 can be omitted.

The resistor R1 can have one end coupled to the input Vin and another end coupled to the input of the inverter 202. The resistor R1 can inhibit electrostatic discharge (ESD) and other transient electrical events from damaging the input-stage circuit 100. In an alternative embodiment, the resistor R1 can be omitted.

Figure 3:
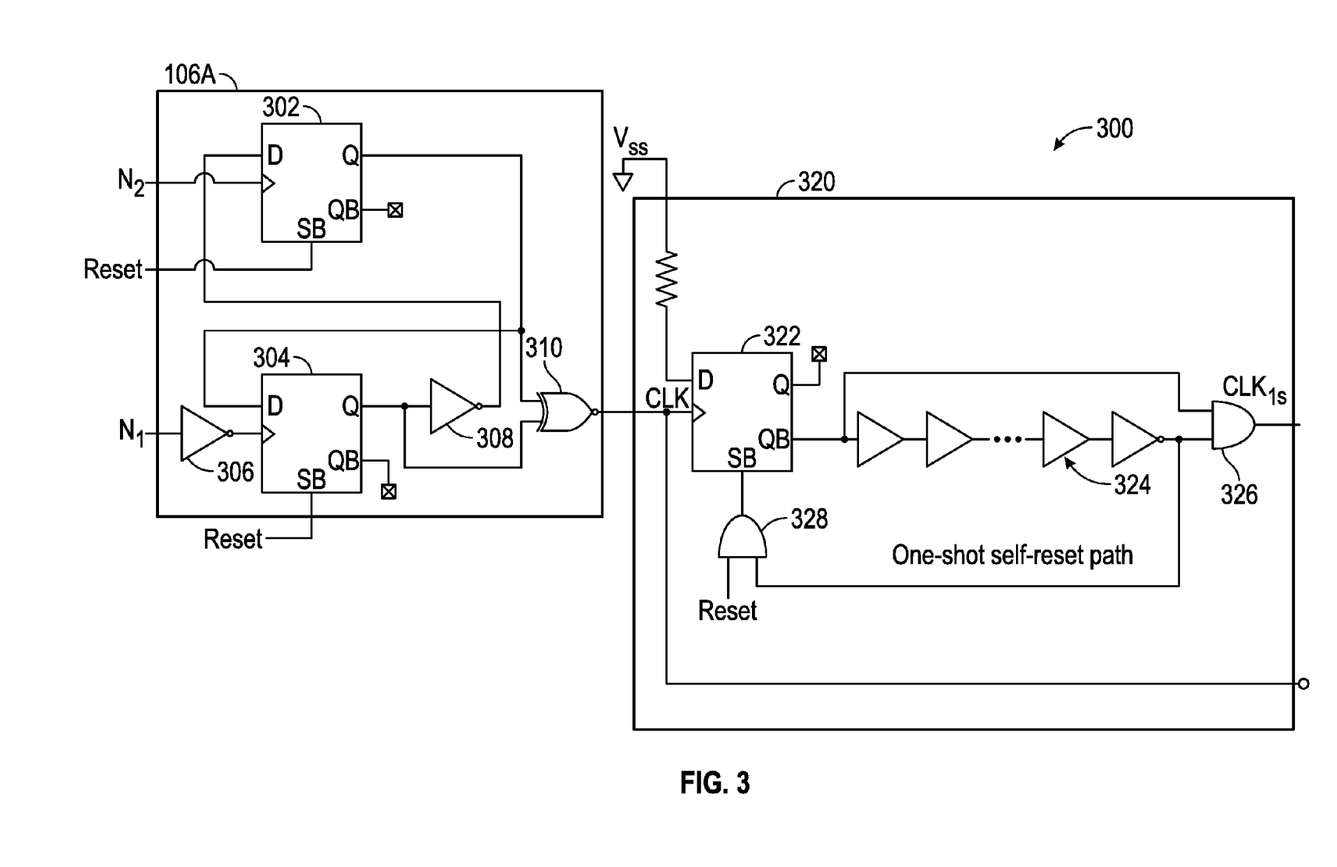
FIG. 3 is a schematic block diagram illustrating a sub-circuit including an example embodiment of a clock detection circuit of the input-stage circuit of FIG. 1.

FIG. 3 is a schematic block diagram illustrating a sub-circuit 300 including an example embodiment of a clock detection circuit 106A, which can correspond to an embodiment of the clock detection circuit 106 of the input-stage circuit 100 of FIG. 1. The clock detection circuit 106A includes D flip flops 302, 304, inverters 306, 308, and an XNOR gate 310. The state signals N1, N2 can be provided by the logic discriminator circuit 104 of FIG. 2. The Reset signal can be provided by an external circuit (not shown).

Additionally, the sub-circuit 300 can include a one-shot circuit 320 that can generate a pulse (e.g., a one-shot pulse) of a predetermined, fixed duration based on the clock signal CLK, such as in response to a rising or falling edge of the clock signal CLK. The one-shot circuit 320 can include a D flip flop 322, a resistor R2, a delay path 324, and AND gates 326, 328. The delay path 324 can include one or more delay elements, such as a plurality of buffers and/or inverters. The number of delay elements can be selected to generate a delay corresponding to the duration of the pulse of the one-shot output CLK1s. As shown in the illustrated embodiment, the delay path can carry a signal from a first end to a second end and can perform a logical compliment operation on the signal. It will be appreciated that the one-shot circuit 320 need not be included in alternative embodiments.

In an example embodiment, the clock detection circuit 106A may be coupled to the logic discriminator circuit 104 of FIG. 2 to receive the state signals N1, N2. The clock detection circuit 106A may generate the clock signal CLK in response to the detected state of the input signal Vin switching between HIGH and LOW states, as described below in greater detail.

The D flip flops 302, 304 each have a clock input, a D input, and Q and QB outputs (which are unused and can be terminated, as shown in FIG. 3). The clock input of the upper D flip flop 302 can receive the state signal N2. The inverter 306 can receive the state signal N1 and can provide the logical compliment of N1 to the clock input of the lower D flip flop 304. The Q output of the upper D flip flop 302 can be coupled to the D input of the lower D flip flop 304. The Q output of the lower D flip flop 304 can be coupled to an input of the inverter 308 to generate an output that is a logical complement of the Q output of the lower D flip flop 304. The output of the inverter 308 can be coupled to the D input of the upper D flip flop 302.

Furthermore, the Q outputs of the D flip flops 302, 304 are coupled to inputs of the XNOR gate 310 to generate the clock signal CLK as an output.

In operation, the clock detection circuit 106A generates the clock signal CLK in response to the state signals N1, N2 alternating between (HIGH, HIGH) and (LOW, LOW) states, which can be indicative the input signal Vin being in the SYNC state. For example, in response to the state transition (LOW, LOW) to (HIGH, HIGH), the upper D flip flop 302 latches and outputs the complemented Q output of the lower D flip flop 304. On the next state transition of (HIGH, HIGH) to (LOW, LOW), the lower D flip flop 304 latches and outputs the Q output of the upper D flip flop 302, which corresponds to the complement of the previous Q output of the lower D flip flop 304. Thus, in this case, the lower D flip flop 304 has toggled its Q output in alternating cycles. Moreover, on the next cycle in which the state signals (N1, N2) transitions (HIGH, HIGH) to (LOW, LOW), the upper D flip flop 302 latches and outputs the complement of the Q output of the upper D flip flop 302, which corresponds to the complement of the previous Q output of the upper D flip flop 302. Thus, in this case, the upper D flip flop 302 has also toggled its Q output in alternating cycles in a pattern that is out of phase with the lower D flip flop 304.

As a result, the inputs of the XNOR gate 310 will be alternatingly toggled in response to the state signals N1, N2 alternating between (HIGH, HIGH) and (LOW, LOW) states. Accordingly, the inputs of the XNOR gate 310 will alternate between receiving matching inputs signals (e.g., (HIGH, HIGH) or (LOW, LOW)) and complimented input signals (e.g., (HIGH, LOW) or (LOW, HIGH)). Accordingly, in response to the state signals N1, N2 repeatedly transitioning between (HIGH, HIGH) and (LOW, LOW) states as described above, the XNOR gate 310 generates its output (e.g., the clock signal CLK) such that its output alternates between HIGH and LOW states. Accordingly, the clock detection circuit 106A generates the clock signal CLK in response to the state signals N1, N2 alternating between (HIGH, HIGH) and (LOW, LOW) states.

Alternatively, in operation, the D flip flops 302, 304 do not trigger in response to the state signals (N1, N2) transitioning to the (HIGH, LOW) state. As stated, the (HIGH, LOW) state of the state signals (N1, N2) can be indicative of the input signal Vin being in the HIGH-Z state. Because neither of the D flip flops 302, 304 trigger in response to a transition to the (HIGH, LOW) state, the Q outputs of the D flip flops 302, 304 do not change in response to the state signals (N1, N2) alternating between (HIGH, HIGH) and (HIGH, LOW) states or in response to the state signals (N1, N2) alternating between (LOW, LOW) and (HIGH, LOW) states. Accordingly, the clock detection circuit 106A does not generate the clock signal CLK in response to the input signal Vin alternating between HIGH and HIGH-Z states or alternating between LOW and HIGH-Z states. Moreover, intervening HIGH-Z states between LOW-HIGH state transitions do not change the operation of the clock detection circuit 106A with respect to generating the clock signal CLK in response to the alternating LOW-HIGH state transitions, as was described above. Accordingly, the clock detection circuit 106A generates the clock signal CLK in response to alternating LOW-HIGH state transitions regardless of intervening HIGH-Z states. On the other hand, in the example embodiment of shown in FIG. 3, the clock detection circuit 106A does not generate (e.g., advance) the clock signal CLK in response to repeated LOW-HIGH-Z state transitions or repeated HIGH-Z HIGH state transitions.

In some embodiments, the output of the XNOR gate 310 can be coupled to a clock input of a D flip flop 322 of the one-shot circuit 320 for generation of a one-shot output CLK1s having a pulse of a predetermined width in response to generating the clock signal CLK. As shown in the example of FIG. 3, the D flip flop 322 can have a clock input coupled to the clock signal CLK, a D input coupled to Vss via the resistor R2—which can serve as a pull-down resistor—, a Q output that can be terminated (e.g., not used), a QB output coupled to a first end of the delay path 324 and coupled to a first input of the AND gate 326, and an SB input for setting the D flip flop 322. The AND gate 326 can have a second input coupled to a second end of the delay path 324. The AND gate 328 can have a first input coupled to the second end of the delay path 324 and a second input coupled to a Reset signal.

In an initial state, the D flip flop 322 may latch the Q output HIGH and the QB output LOW. Accordingly, the first input of the AND gate 326 is asserted LOW and the second input of the AND gate 326 is asserted HIGH, producing the one-shot output LOW. In operation, a rising edge of the clock signal CLK triggers the D flip flop 322 to latch the D input, which has been pulled LOW by the resistor R2. Accordingly, the QB output of the D flip flop 322 is asserted HIGH, which is fed to the first input of the AND gate 326. Furthermore, the second end (e.g., the output end) of the delay path 324 is asserted LOW after a delay. During the delay period, because both inputs of the AND gate 326 are asserted HIGH, the AND gate 326 asserts the one-shot output CLK1s HIGH. After the delay period, the second end of the delay path 324 is asserted LOW. Thus, the one-shot output CLK1s is asserted LOW by the AND gate 326. Moreover, the AND gate 328 resets the D flip flop 322 such that the QB output of the D flip flop 322 is asserted HIGH. Accordingly, each rising edge of the clock signal CLK asserts the one-shot output CLK1s HIGH for a duration approximately equal to the delay of the delay path 324.

Figure 4:
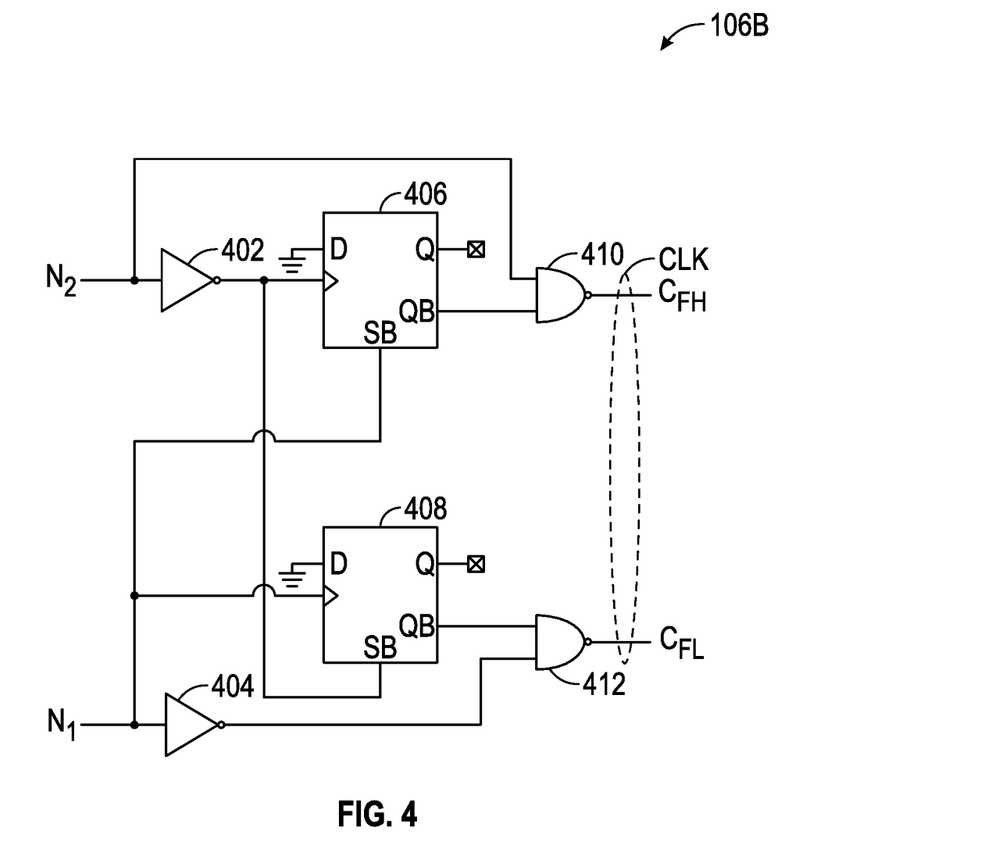
FIG. 4 is a schematic block diagram illustrating another example embodiment of a clock detection circuit of the input-stage circuit of FIG. 1.

FIG. 4 is a schematic block diagram illustrating another example embodiment of a clock detection circuit 106B of the input-stage circuit 100 of FIG. 1. The clock detection circuit 106B includes inverters 402, 404, D flip flops 406, 408, and NAND gates 410, 412. The clock detection circuit 106B receives the state signals N1, N2 as inputs and provides the high clock signal CFH and the low clock signal CFL as outputs in accordance with detecting a first SYNC state and a second SYNC state, respectively. The high clock signal CFH and the low clock signal CFL may correspond to components of a multidimensional clock signal CLK.

The clock detection circuit 106B can interface with the logic discriminator circuit 104 of FIG. 2 to receive the state signals N1, N2 that indicate the static state of the input signal Vin. The first SYNC state can correspond to the input signal Vin alternating between HIGH and HIGH-Z states. The second SYNC state can correspond to the input signal Vin alternating between LOW and HIGH-Z states. These patterns that determine the first and second SYNC states of the input signal Vin are described herein by way of explanation only and are not limiting. Rather, it will be appreciated that in alternative embodiments the first and second clock states can be determined by any detectable patterns.

In the illustrated embodiment of FIG. 4, the clock detection circuit 106B can include a first signal path formed by the upper inverter 402, the upper D flip flop 406, and the upper NAND gate 410 for receiving the state signals N1, N2 and generating the high clock signal CFH. In particular, the upper inverter 402 has an input node to receive the state signal N2 and an output node coupled to a clock input node of the upper D flip-flop 406. The input node of the upper inverter 402 is additionally coupled to a first input node of the upper NAND gate 410. The upper D flip-flop 406 has a D input node set to a low logic voltage (e.g., tied to ground), a SB input node to receive the state signal N1, a Q output node coupled to a terminal node (e.g., not used), a QB output node coupled to a second input node of the upper NAND gate 410 for providing the compliment of the stored state of the upper D flip flop 406. Asserting the SB input of the upper D flip flop 406 LOW can set the stored state of the upper D flip flop 406 to the HIGH state. The upper NAND gate 410 has an output node to provide the high clock signal CFH.

In operation, the first signal path can synchronize the high clock signal CFH to the input signal Vin in response to the input signal Vin being switched between HIGH and HIGH-Z states in repetition. In this case, as stated in connection with FIG. 2, the state signals (N1, N2) alternate between (HIGH, HIGH) and (HIGH, LOW) states. Accordingly, the SB input of the upper D flip flop 406 remains constant and the QB output is asserted HIGH and remains HIGH after the first falling edge of the state signal N2. As such, the first input of the upper NAND gate 410 alternates between HIGH and LOW with the state signal N2 and the second input of the upper NAND gate 410 remains constant at HIGH. Accordingly, the high clock signal CFH alternates between HIGH and LOW states in response to the state signals (N1, N2) alternating between (HIGH, HIGH) and (HIGH, LOW) states. Furthermore, the lower clock signal CFL remains asserted in the LOW state because the first input of the lower NAND gate 412 is a constant LOW state.

Moreover, an intervening (LOW, LOW) state of the state signals (N1, N2) can set the QB output of the upper D flip flop 406 LOW for at least until the next falling edge of the state signal N2. Accordingly, the high clock signal CFH should not synchronize with input signal Vin in response to the input signal Vin being in the LOW state.

The clock detection circuit 106B can include a second signal path formed by the inverter 404, the lower D flip flop 408, and the NAND gate 412. The second signal path receives the state signals N1, N2 and generates low clock signal CFL. In particular, the inverter 404 has an input node to receive the state signal N1 and an output node coupled to a first input node of the NAND gate 412. The lower D flip flop 408 has a clock input node to receive the state signal N1, a D input node set to a low logic voltage (e.g., tied to ground), a SB input node to receive the compliment of the state signal N2 (e.g., via the output node of the inverter 402), a Q output node coupled to a terminal node (e.g., not used), a QB output node coupled to a second input node of the NAND gate 412 for providing the compliment of the stored state of the lower D flip flop 408. The lower NAND gate 412 has an output node to provide the low clock signal CFH.

In operation, the second signal path can synchronize the low clock signal CFL to the input signal Vin in response to the input signal Vin being switched between LOW and HIGH-Z states in repetition. In this case, as stated in connection with FIG. 2, the state signals (N1, N2) alternate between (LOW, LOW) and (HIGH, LOW) states. Accordingly, the SB input of the lower D flip flop 408 remains fixed at the HIGH state and the QB output is asserted and remains HIGH after the first rising edge of the state signal N1. As such, the first input of the lower NAND gate 412 alternates between HIGH and LOW with the state signal N1 and the second input of the lower NAND gate 412 remains constant at HIGH. Accordingly, the low clock signal CFL alternates between HIGH and LOW states in response to the state signals (N1, N2) alternating between (LOW, LOW) and (HIGH, LOW) states. Further-more, the high clock signal CFH remains asserted in the LOW state because the first input of the upper NAND gate 410 is fixed at the LOW state.

Moreover, an intervening (HIGH, HIGH) state of the state signals (N1, N2) can set the QB lower of the lower D flip flop 408 LOW for at least until the next rising edge of the state signal N1. Accordingly, the low clock signal CFL should not synchronize with input signal Vin in response to the input signal Vin being in the HIGH state.

Figure 5:
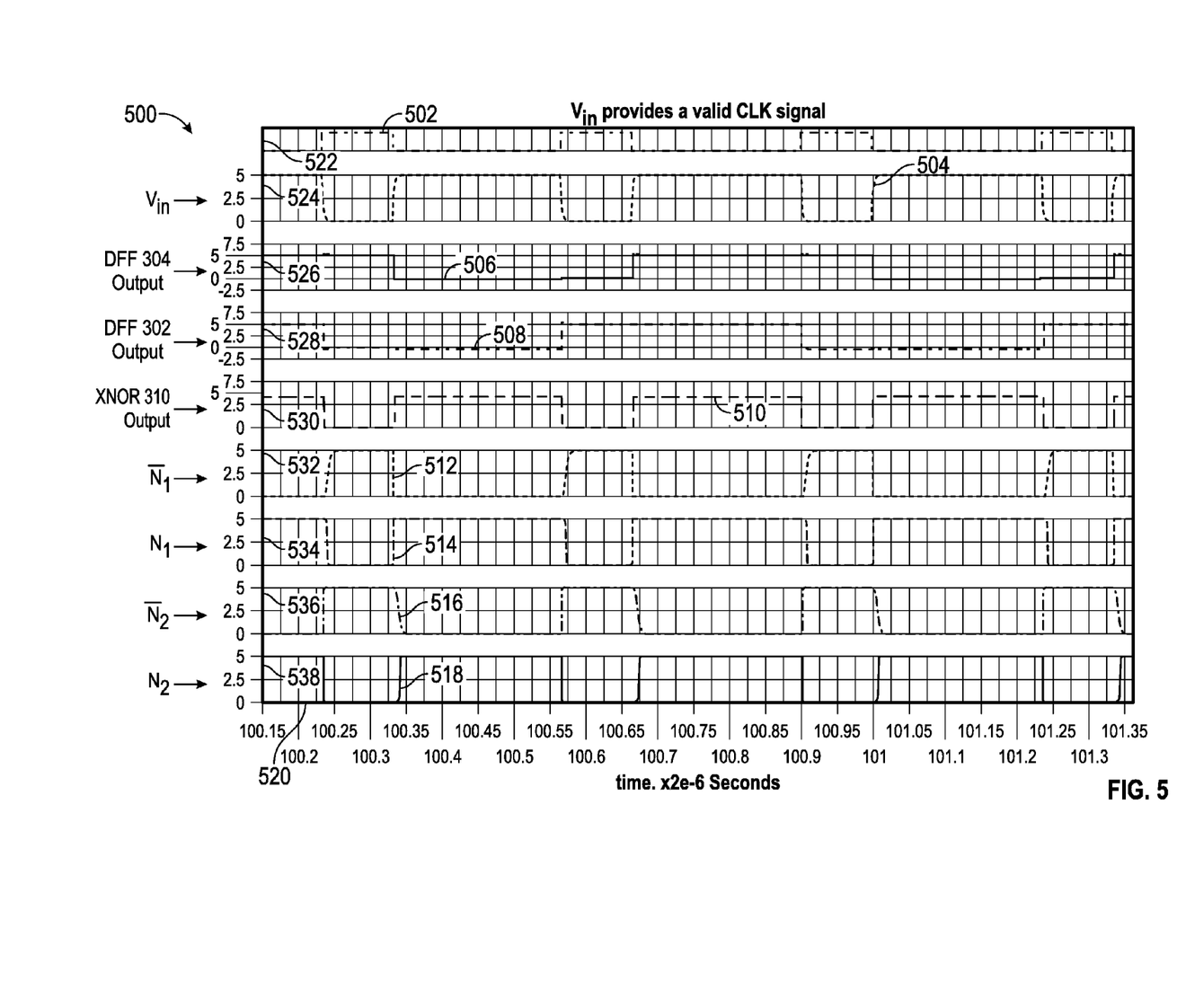
FIGS. 5-7 are plots illustrating simulation results of operation of an embodiment of the input-stage circuit of FIG. 1 for various types of input signals Vin.
Figure 6:
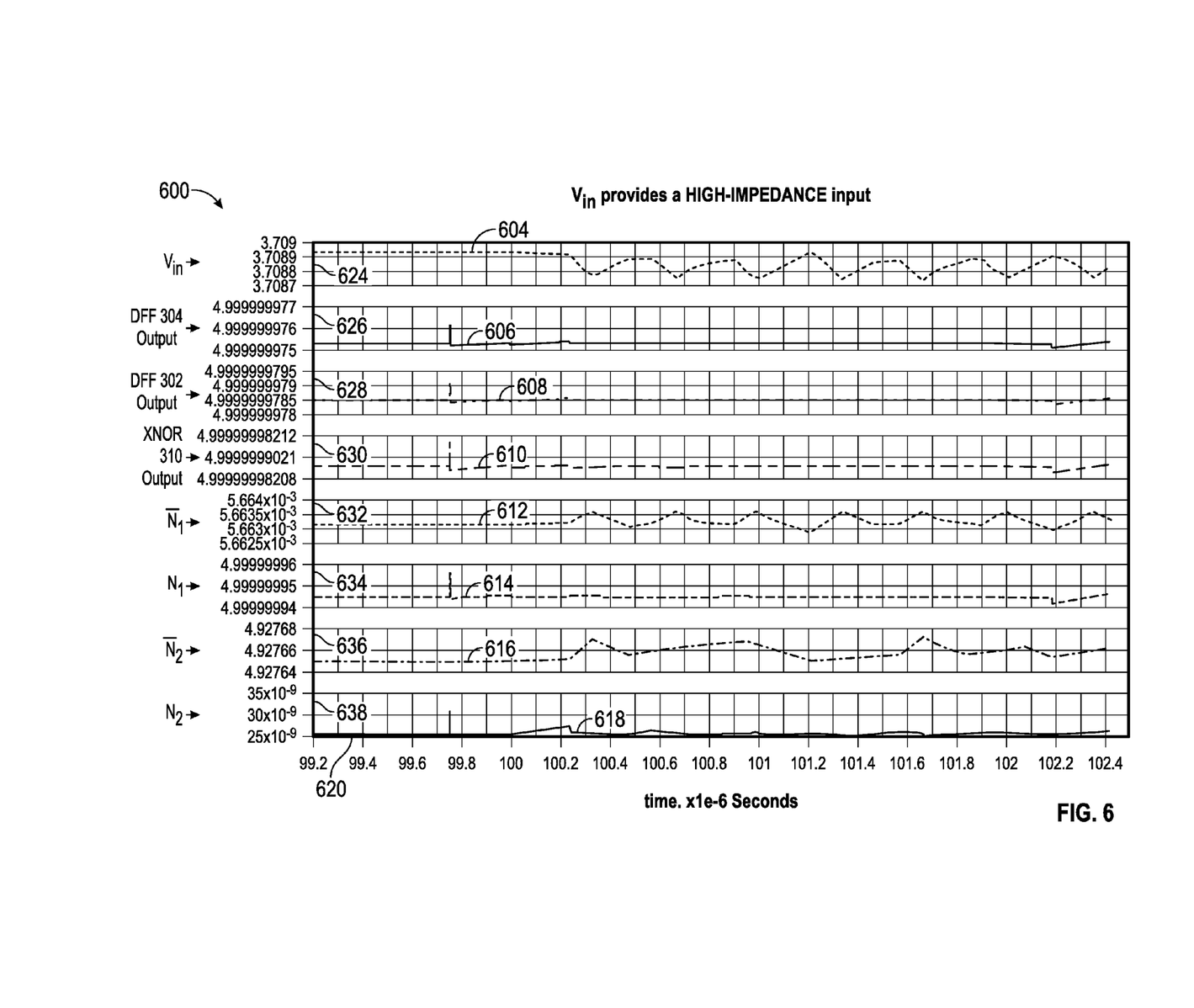
Figure 7:
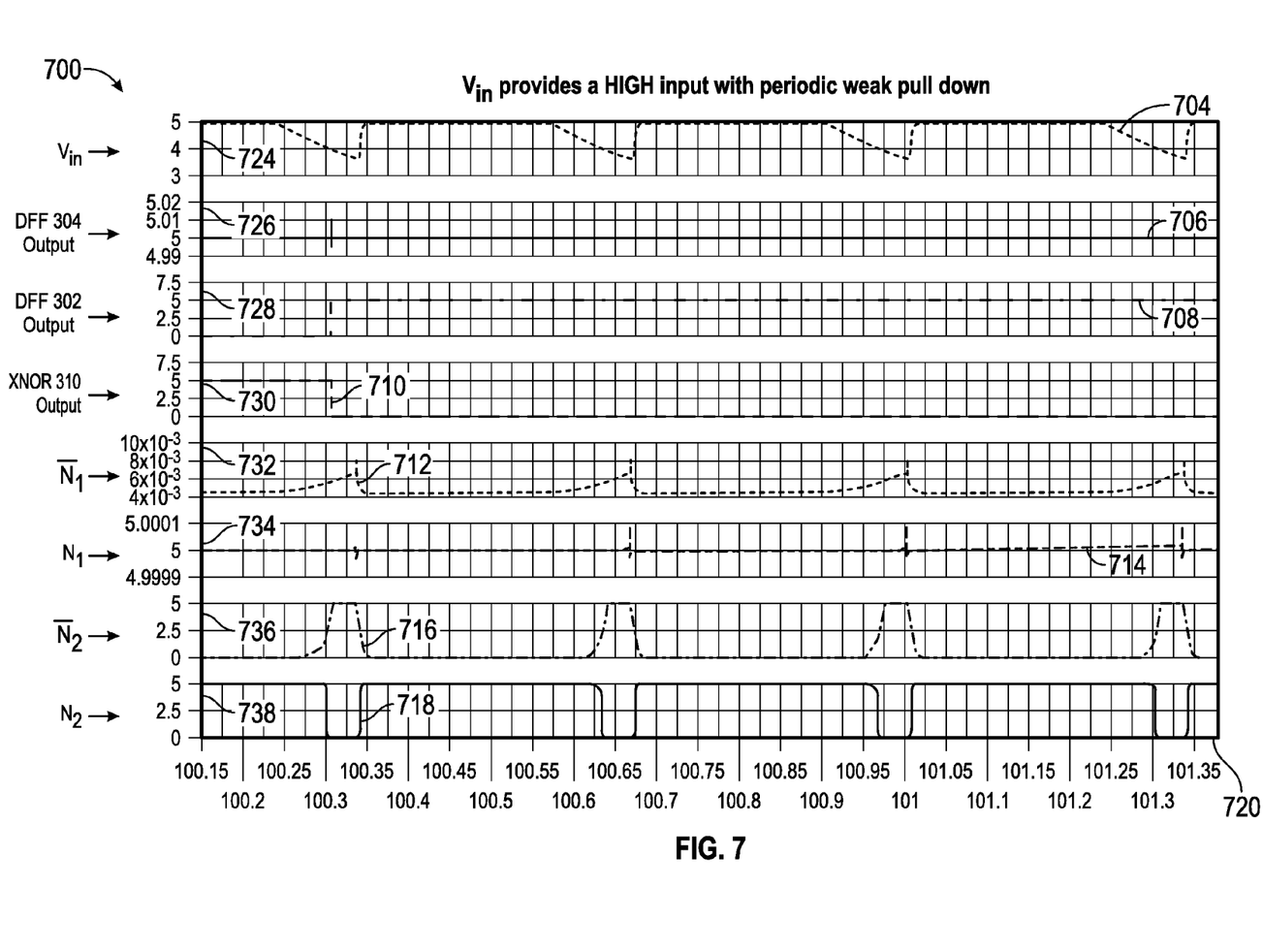

FIGS. 5-7 are plots illustrating simulation results for various input signals Vin applied to the state detection circuit 102 and the logic discriminator circuit 104 of FIG. 2 interfaced with the clock detection circuit 106A of FIG. 3.

FIG. 5 includes plots of example simulation results 500 using the input signal Vin alternating between HIGH and LOW states in a valid SYNC state. In particular, the curve 502 represents a clock output (e.g., the logical compliment of the clock signal CLK of FIG. 2); the curve 504 represents the input signal Vin periodically switching between HIGH and LOW states; the curve 506 represents the Q output of the lower D flip flop 304 of FIG. 3; the curve 508 represents the Q output of the upper D flip flop 302 of FIG. 3; the curve 510 represents the clock signal CLK generated at the output of the XNOR gate 310 of FIG. 3; the curves 512, 514 represent the state signals $\overline{N}_1$ and N1, respectively, of FIG. 2; and the curves 516, 518 represent the state signals $\overline{N}_2$ and N2, respectively, of FIG. 2. The ranges 522-538 of the vertical axis correspond to the voltages of the respective curves 502-518. The horizontal axis 520 represents time.

As stated, the input signal Vin switches between HIGH and LOW states in a valid clock state. As such, the state signals N1, N2 switch between HIGH and LOW states in phase. Moreover, the Q outputs of the D flip flops 302, 304 alternate toggling between states for each rising or falling edge of the input signal Vin. Accordingly, the output of the XNOR gate 310 produces a clock waveform that is synchronized with the input signal Vin.

FIG. 6 includes plots of example simulation results 600 generated with the input signal Vin asserted in the HIGH-Z state. In particular, the curve 604 represents the input signal Vin periodically switching between HIGH and LOW states; the curve 606 represents the Q output of the lower D flip flop 304 of FIG. 3; the curve 608 represents the Q output of the upper D flip flop 302 of FIG. 3; the curve 610 represents the clock signal CLK generated at the output of the XNOR gate 310 of FIG. 3; the curves 612, 614 represent the state signals $\overline{N}_1$ and N1, respectively, of FIG. 2; and the curves 616, 618 represent the state signals $\overline{N}_2$ and N2, respectively, of FIG. 2. The ranges 624-638 of the vertical axis correspond to the voltages of the respective curves 604-618. The horizontal axis 620 represents time.

As stated, the input signal Vin is asserted in the HIGH-Z state. As such, the state detection circuit 102 pulls the input signal Vin to a value that is about a threshold voltage Vt plus an offset away from the HIGH state (Vdd). Accordingly, the logic discriminator circuit 104 asserts the state signals N1, N2 HIGH and LOW, respectively. Moreover, the Q outputs of the D flip flops 302, 304 are each asserted HIGH. Accordingly, the XNOR gate 310 asserts its output HIGH.

FIG. 7 includes plots of example simulation results 700 generated with the input signal Vin asserted in the HIGH state and periodically pulled down to simulate the effects of disturbances and signal noise. The input-stage circuit 100 should not detect a valid synchronization signal in this instance. The curve 704 represents the input signal Vin; the curve 706 represents the Q output of the lower D flip flop 304 of FIG. 3; the curve 708 represents the Q output of the upper D flip flop 302 of FIG. 3; the curve 710 represents the clock signal CLK generated at the output of the XNOR gate 310 of FIG. 3; the curves 712, 714 represent the state signals $\overline{N}_1$ and N1, respectively, of FIG. 2; and the curves 716, 718 represent the state signals $\overline{N}_2$ and N2, respectively, of FIG. 2. The ranges 724-738 of the vertical axis correspond to the voltages of the respective curves 704-718. The horizontal axis 720 represents time.

As stated, the input signal Vin is asserted in the HIGH state and is repeatedly pulled down from Vdd by an external circuit. The input signal Vin is pulled weakly such that the input signal Vin is not pulled completely down to Vss before returning to the HIGH state. The logic discriminator circuit 104 asserts the state signals N1 HIGH and N2 HIGH during the period where Vin is within a threshold voltage Vt of Vdd (5 V), thereby indicating the HIGH state. The logic discriminator circuit 104 asserts the state signals N1 HIGH and N2 LOW during the period where Vin is not within a threshold voltage Vt of Vdd, thereby indicating the HIGH-Z state. Moreover, the XNOR gate 310 does not produce an oscillating cock signal CLK, as shown by curve 710, because the input signal Vin does not correspond to a valid SYNC state.

The circuits described herein can be implemented using any suitable semiconductor process technology. An example embodiment can implemented using a 0.18 μm 5 V/1.8 V mixed signal process and has been demonstrated as functional in 5 V devices. It will be appreciated by a person of ordinary skill, however, that systems and methods disclosed herein may be implemented using other device line-widths and logic voltage ranges based on considerations of the application.

The NMOS and PMOS transistors described herein can correspond to insulated gate field-effect transistors, such as MOSFETs. However, it will be understood that a gate can be made from materials other than metals, such as polysilicon, and an insulation layer can be made out of materials other than silicon oxide, such as a high k dielectric. It will also be understood that the FETs can have various structural types other than MOSFETs, including, but not limited to, BJT, JFET, IGFET, MESFET, pHEMT, HBT, and the like transistor structural types. Further, FETs can also have various polarities, such as N-channel, P-channel, NPN-type, and PNP-type; and can include various semiconductor materials, such as Si, SiC, GaAs, GaN, SiGe, and the like.

Some of the embodiments disclosed herein have been described with specific signals implemented as current-mode or voltage-mode signals, but the inventive principles also contemplate other types of signals, whether characterized as voltages or currents.

Applications

Devices employing the above-described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a power converter, mobile phone, base stations, communication modems, a telephone, a television, a computer monitor, a computer, a handheld computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this inventive subject matter has been described in terms of certain embodiments, other embodiments that are apparent to those of ordinary skill in the art, including embodiments that do not provide all of the features and benefits set forth herein, are also within the scope of this inventive subject matter. Moreover, the various embodiments described above can be combined to provide further embodiments. In addition, certain features shown in the context of one embodiment can be incorporated into other embodiments as well. Accordingly, the scope of the present inventive subject matter is defined only by reference to the appended claims.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment, assuming that the functionality of the depicted circuits is not adversely affected.

What is claimed is:

1. A circuit to detect signal states, the circuit comprising:
an input node to receive an input signal;
a state detection circuit to detect a state of the input signal and to generate a detection signal, the state corresponding to at least one of three states, the detection signal having a level based on the detected state of the input signal;
a logic discriminator circuit to generate first and second state signals based at least partly on the level of the detection signal; and
a clock detection circuit to generate a clock signal based at least partly on a sequence of logic transitions of the first and second state signals.

2. The circuit of claim 1, wherein the at least three states include a logic-high state, a logic-low state, and a high-impedance state.

3. The circuit of claim 1, wherein the state detection circuit detects the state of the input signal asynchronously in response to receiving the input signal.

4. The circuit of claim 1, further comprising first and second power supply nodes, wherein the state detection circuit comprises:
an inverter having an input to receive the input signal, an output to provide the detection signal, and first and second power supply nodes, wherein the output of the inverter is coupled to the input of the inverter;
a first current source to provide a first current to the first power supply node of the inverter; and
a second current source to provide a second current to the second power supply node of the inverter, the first current and the second current having different magnitudes.

5. The circuit of claim 4, wherein the first and second current sources are sized such that the magnitude of the first current is greater than about 5% of the magnitude of the second current.

6. The circuit of claim 4, wherein the first current source includes a first transistor having a source coupled to the first power supply node and a drain coupled to a first power supply terminal of the inverter, and the second current source includes a second transistor having a source coupled to the second power supply node and a drain coupled to a second power supply terminal of the inverter.

7. The circuit of claim 4, wherein the logic discriminator circuit generates the first and second state signals each at a first logic level in response to the level of the detection signal being within a predetermined threshold of the first power supply node, the logic discriminator generates the first and second state signals each at a second logic level in response to the level of the detection signal being within a predetermined threshold of the second power supply node, and the logic discriminator generates the first state signal at the first logic level and the second state signal at the second logic level in response to the level of the detection signal being outside the predetermined thresholds from the first and second power supply nodes.

8. The circuit of claim 4, wherein the logic discriminator circuit comprises:
  a first node having an electrical characteristic, the level of the first state signal being based on the electrical characteristic;
  a pull-down circuit that pulls down the first node to approximately a voltage of the first power supply node in response to being activated; and
  a switch circuit that activates the pull-down circuit in response to the level of the detection signal being greater than a first threshold, and deactivates the pull-down circuit in response to the level of the detection signal being less than the first threshold.

9. The circuit of claim 1, wherein the clock detection circuit advances the clock signal in response to the state of the input signal transitioning between first and second states of the at least three states, and wherein the clock detection circuit does not advance the clock signal in response to the state of the input signal transitioning between a third state of the at least three state and either the first state or the second state.

10. The circuit of claim 1, wherein the clock detection circuit comprises:
  a first inverter to negate the first state signal;
  a first flip flop circuit having a set-value input, an output, and a clock input, the clock input of the first flip flop circuit to receive the negated first state signal;
  a second inverter to negate the output of the first flip-flop circuit;
  a second flip flop circuit having a set-value input to receive the negated output of the first flip flop circuit, an output coupled to the clock input of the first flip flop circuit, and a clock input to receive the second state signal; and
  a logic circuit to generate the clock signal by performing a complementary exclusive-OR (XOR) operation on the outputs of the first and second flip flop circuits.

11. A method to detect input states, the method comprising:
  receiving an input signal;
  generating a detection signal based on detecting a state of the input signal, the state corresponding to at least one of three states, the detection signal having a level based on the detected state of the input signal;
  generating first and second state signals based at least partly on the level of the detection signal; and
  generating a clock signal based at least partly on a sequence of logic transitions of the first and second state signals.

12. The method of claim 11, wherein the at least three states include a logic-high state, a logic-low state, and a high-impedance state.

13. The method of claim 11, wherein the detecting of the state of the input signal includes asynchronously detecting the state of the input signal in response to receiving the input signal.

14. The method of claim 11, wherein:
  the generating of the detection signal includes providing the input signal to an input node of an inverter, the inverter having an output node to provide the detection signal, the inverter having first and second power supply nodes, wherein the output node of the inverter is coupled to the input node of the inverter;
  supplying a first current to the first power supply node of the inverter; and
  supplying a second current to the second power supply node of the inverter, wherein the first current and the second current have different magnitudes.

15. The circuit of claim 14, wherein the magnitude of the first current is greater than about 5% of the magnitude of the second current.

16. An apparatus to detect input states, the apparatus comprising:
  means for receiving an input signal;
  means for detecting a state of the input signal and to generate a detection signal, the state corresponding to at least one of three states, the detection signal having a level based on the detected state of the input signal;
  means for generating first and second state signals based at least partly on the level of the detection signal; and
  means for generating a clock signal based at least partly on a sequence of logic transitions of the first and second state signals.

17. The apparatus of claim 16, wherein the at least three states include a logic-high state, a logic-low state, and a high-impedance state.

18. The apparatus of claim 16, wherein the detecting means is configured to detect the state of the input signal asynchronously in response to receiving the input signal.

19. The apparatus of claim 16, further comprising means for providing first and second supply currents to the detecting means, the first supply current and the second supply current having different magnitudes.

20. The apparatus of claim 19, wherein the magnitude of the first current is greater than about 5% of the magnitude of the second current.

\* \* \* \* \*